United States Patent
Reuter

(10) Patent No.: US 10,483,724 B2
(45) Date of Patent: Nov. 19, 2019

(54) PANEL HOLDER FOR FASTENING A PANEL TO A HOUSING FRAME OF A SWITCHGEAR CABINET, AND CORRESPONDING SWITCHGEAR CABINET

(71) Applicant: RITTAL GMBH & CO. KG, Herborn (DE)

(72) Inventor: Wolfgang Reuter, Liebenscheid (DE)

(73) Assignee: Rittal GmbH & Co. KG (DE)

( * ) Notice: Subject to any disclaimer, the term of this patent is extended or adjusted under 35 U.S.C. 154(b) by 0 days.

(21) Appl. No.: 16/301,873

(22) PCT Filed: Apr. 19, 2017

(86) PCT No.: PCT/DE2017/100313
§ 371 (c)(1),
(2) Date: Nov. 15, 2018

(87) PCT Pub. No.: WO2018/001406
PCT Pub. Date: Jan. 4, 2018

(65) Prior Publication Data
US 2019/0157847 A1    May 23, 2019

(30) Foreign Application Priority Data
Jun. 27, 2016    (DE) .................. 10 2016 111 702

(51) Int. Cl.
*H02B 1/01*    (2006.01)
*H02B 1/30*    (2006.01)
*H05K 7/18*    (2006.01)

(52) U.S. Cl.
CPC ............. *H02B 1/012* (2013.01); *H02B 1/013* (2013.01); *H02B 1/301* (2013.01); *H05K 7/183* (2013.01)

(58) Field of Classification Search
CPC ........ H02B 1/012; H02B 1/013; H02B 1/301; H05K 7/183
See application file for complete search history.

(56) References Cited

U.S. PATENT DOCUMENTS 5,894,106 A * 4/1999 Schwenk ........... H01R 13/6583
174/50
5,930,972 A * 8/1999 Benner .................... H02B 1/01
52/653.1

(Continued)

FOREIGN PATENT DOCUMENTS

CH          348192 A      8/1960
DE      19520084 C1 *    7/1996    ............. H02B 1/301

(Continued)

OTHER PUBLICATIONS

International Search Report (in English and German) and Written Opinion (in German) issued in PCT/DE2017/100313, dated Aug. 18, 2017; ISA/EP.

*Primary Examiner* — Daniel J Rohrhoff
(74) *Attorney, Agent, or Firm* — Harness, Dickey & Pierce, PLC

(57) ABSTRACT

The invention relates to a panel holder for fastening a panel on a housing frame of a switchgear cabinet, wherein the panel holder is an open clip, which has two free push-in portions, which can be braced against one another for engagement in a recess of a housing frame, wherein the push-in portions are connected to one another by means of a fastening flange for a panel, said flange having a threaded passage, in particular a threaded bore, and wherein the fastening flange is arranged at a distance from one of the push-in portions and the threaded passage is arranged in alignment with the push-in portion, such that a screw screwed in through the threaded passage impinges on the push-in portion aligned with the threaded passage and thus (Continued)

braces the push-in portions against one another. A corresponding switchgear cabinet is also described.

11 Claims, 6 Drawing Sheets

(56) References Cited

U.S. PATENT DOCUMENTS

| | | | |
|---|---|---|---|
| 6,012,791 A | | 1/2000 | Benner et al. |
| 6,042,395 A | * | 3/2000 | Munch ................. H01R 4/64 |
| | | | 439/92 |
| 6,164,985 A | * | 12/2000 | Reuter ................. H01R 4/64 |
| | | | 361/800 |
| 6,533,605 B1 | * | 3/2003 | Reuter ................. H02B 1/303 |
| | | | 439/431 |
| 9,871,353 B2 | | 1/2018 | Boehme et al. |
| 9,991,684 B2 | | 6/2018 | Brueck et al. |
| 2016/0352080 A1 | * | 12/2016 | Brueck ................. H02B 1/013 |
| 2016/0352082 A1 | | 12/2016 | Boehme et al. |
| 2016/0352083 A1 | | 12/2016 | Brueck et al. |
| 2017/0127555 A1 | * | 5/2017 | Anderson ................. H05K 7/18 |

FOREIGN PATENT DOCUMENTS

| | | | | |
|---|---|---|---|---|
| DE | 19525851 C1 | | 7/1996 | |
| DE | 19525881 C1 | | 7/1996 | |
| DE | 19801720 C1 | | 7/1999 | |
| DE | 10149599 C1 | | 2/2003 | |
| DE | 10328403 A1 | | 1/2005 | |
| DE | 102014101404 A1 | | 8/2015 | |
| DE | 202016100789 U1 | * | 5/2016 | ............. H05K 7/183 |
| DE | 102017108523 A1 | * | 10/2018 | ............... H02B 1/32 |

\* cited by examiner

PANEL HOLDER FOR FASTENING A PANEL TO A HOUSING FRAME OF A SWITCHGEAR CABINET, AND CORRESPONDING SWITCHGEAR CABINET

CROSS-REFERENCE TO RELATED APPLICATIONS

This application is a 371 U.S. National Stage of International Application No. PCT/DE2017/100313, filed on Apr. 19, 2017, which claims priority to German Application No. 10 2016 111 702.1, filed Jun. 27, 2016. The entire disclosures of the above applications are incorporated herein by reference.

BACKGROUND

This section provides background information related to the present disclosure which is not necessarily prior art.

Technical Field

The invention is directed to a panel holder for fastening a panel to a housing frame of a switchgear cabinet. Such a panel holder is known from DE 198 01 720 C1, DE 195 25 881 C1, DE 103 28 403 A1, and DE 195 25 851 C1.

Discussion

The panel holders known from the prior art have the disadvantage that they are constructed comparatively complexly and are thus costly to produce and additionally complex to use. It is frequently necessary for the fastening of a panel on the housing frame of a switchgear cabinet for the panel holder to be screwed onto the housing frame in a first step, wherein in general multiple panel holders are required simultaneously for fastening a panel, and the panel can only be screwed onto the panel holders and thus onto the housing frame after the pre-mounting of the panel holders on the housing frame.

SUMMARY

This section provides a general summary of the disclosure, and is not a comprehensive disclosure of its full scope or all of its features.

It is therefore the aspect of the invention to refine a panel holder of the type described at the outset such that it is cost-effective to produce and simple to use.

It is accordingly provided that the panel holder is an open clip, which has two free push-in portions, which can be braced against one another for engagement in a recess of a housing frame. The push-in portions are connected to one another by means of a fastening flange for a panel, said flange having a threaded passage, wherein the fastening flange is arranged at a distance from one of the push-in portions and the threaded passage is arranged in alignment with this push-in portion. A screw screwed in through the threaded passage impinges on the push-in portion aligned with the threaded passage and thus braces the push-in portions against one another.

Due to the design of the panel holder as a clip, the panel holder can be designed, for example, as a simple sheet-metal shaped part. The panel holder can also be produced from an electrically conductive plastic, however. The panel holder can be formed in particular integrally and/or completely from the same material. This reduces the production costs of the panel holder. The design as a clip furthermore makes it possible for the panel holder to be able to be pre-mounted in a captive manner on a housing frame by simply pushing or clipping it into existing recesses of a profile strut of the housing frame, the pre-mounting of the panel holder on the panel frame can therefore be performed without tools. The panel holder is braced by the screwing together of the panel with the panel holder via the threaded passage, which can be formed, for example, as a threaded bore or welded nut, and therefore a fixed connection is formed between the housing frame, the panel holder, and the panel.

The push-in portion aligned with the threaded passage can have a free surface for a screw screwed in through the threaded passage, which, at least in a relaxed state of the panel holder or when the panel holder is preinstalled on a vertical profile, i.e., a fastening screw is not yet screwed into the panel holder, extends nonparallel and preferably at an angle between 10° and 60° and particularly preferably at an angle between 20° and 50° in relation to the fastening flange.

The push-in portion aligned with the threaded passage can be connected via a curved bracing portion to the fastening flange, wherein the push-in portion aligned with the threaded passage has a free push-in lug for the engagement in a housing frame on its end facing away from the curved bracing portion.

The push-in lug can protrude in this case from a contact side of the end facing away from the curved bracing portion of the plug-in portion aligned with the threaded passage, wherein the contact side has gear teeth and/or contact claws.

The further push-in portion can have a hook on its end facing away from the fastening flange on an outer side of the panel holder. The hook can be configured for the purpose of engaging behind a border of the recess, via which the further push-in portion engages in the housing frame. The hook can be open toward the outer side of the panel holder for this purpose. The panel holder can exclusively consist of an integrally embodied shaped part, in particular an integrally embodied sheet-metal shaped part. The panel holder can be, for example, a folded sheet-metal shaped part, in which the threaded passage is formed as a threaded bore. To regulate the elastic behavior of the panel holder, the sheet-metal shaped part can have at least one cutout. For example, the curved bracing portion can be a portion of the sheet-metal shaped part, which has at least one material recess, and therefore the panel holder has a lower bending torque in comparison to the remaining portions of the panel holder in the region of the bracing portion. The deformation of the panel holder during the pre-tensioning of the panel holder by the screwing of a screw into the threaded passage can thus be regulated.

For example, the bracing portion can be configured for the purpose of absorbing essentially the entire deformation of the panel holder in the course of the bracing of the panel holder. In particular, the panel holder can be configured such that it absorbs all deformations of the panel holder in the course of the bracing in favor of the fastening flange, and therefore the fastening flange always provides a level mounting side for a panel part independently of the bracing state of the panel holder.

The threaded passage can be, for example, a threaded bore through the fastening flange or a press-fit nut or welded nut fixed in a passage opening through the fastening flange. However, the formation of the threaded passage through the fastening flange is not to be restricted to any specific embodiments in principle.

According to another aspect, the invention relates to a switchgear cabinet having a housing frame made of vertical struts and horizontal struts formed as hollow profiles, on which at least one panel is fixed on an outer side of the housing frame via a panel holder of the above-described type. The horizontal and vertical struts can be designed in particular as identical struts, i.e., as struts having identical cross section. Solely by way of example, the profile struts can have one of the geometries which are disclosed in DE 10 2014 101 404 A1. In particular, profile struts which have a mounting plane setback in relation to an outer sealing plane of the housing frame are advantageous, such that the panel holder can be accommodated in the receptacle space formed between the sealing plane and the mounting plane and can be placed on the housing frame from the outer side of the housing frame. The sealing frame is formed in particular by an outer sealing edge of the profile struts of the housing frame, wherein the sealing edge comes into contact on a sealing element on the inner side of a panel and possibly compresses it when the panel is screwed on to the housing frame.

At least one of the vertical and horizontal struts can have two profile sides extending at an angle, in particular a 90° angle in relation to one another and preferably merging into one another. A first of the push-in portions can engage in a first of the two profile sides and a second of the push-in portions can engage in a second of the two profile sides.

The profile struts can in particular have a system perforation having an arrangement of regularly spaced-apart recesses, wherein the panel holder in particular engages via the recesses of the system perforation in the profile struts. A first of the two profile struts can have an arrangement made of recesses for the interior construction of the switchgear cabinet for this purpose, wherein a second of the profile sides, with a further profile side, which merges into the second profile side via a folded edge having a direction change comprising at least 180°, forms a sealing edge for the sealing of the panel in relation to the housing frame.

As already described, the panel can be connected to the panel holder via a screw screwed into the threaded passage. In this case, the screw can have a cup point for the electrical contacting of the threaded passage and can have gear teeth for electrical contacting of the panel on its screw head facing toward the panel.

The switchgear cabinet can furthermore have a mounting chassis for the interior construction of the switchgear cabinet, wherein one of the two profile sides of a vertical or horizontal profile of the housing frame has an arrangement of recesses and the mounting chassis is mounted via its fastening flange on the profile side having the recesses. Such an arrangement is known from DE 10 2014 101 404 A1. It can now be provided for the use of the described panel holder that the fastening flange has a cutout in which the push-in portion engaging in the profile side is accommodated. Alternatively or additionally, it can be provided that the fastening flange has at least one feedthrough, which aligns with one of the recesses, wherein the panel holder engages through the feedthrough into the first profile side with the push-in portion engaging in the first profile side, and wherein the push-in portion engaging in the first profile side has contact teeth, with which it electrically contacts a border of the feedthrough.

The panel holder can be configured in particular for fastening via a grid perforation, in particular a system perforation of the profile struts of a housing frame of a switchgear cabinet, without the use of fastening means such as screws. Furthermore, the panel holder can be used universally as an equivalent part for the fastening of side walls, rear walls, and roof surfaces of a switchgear cabinet, and therefore a single equivalent part is provided for all fastening of panels and/or paneling parts on the housing frame. Due to the use of the grid perforation for the mounting of the panel holder, the mounting positions of the panel holder can be uniquely specified, whereby the mounting of the panels on the housing frame is further facilitated. As previously shown, the panel holder according to the invention permits embodiments which enable the mounting of the holder on the completely equipped switchgear cabinet, i.e., in particular even if a chassis is already installed on one of the mounting planes, via which the panel holder is also to be fixed. It has also been shown that the panel holder enables embodiments in which in spite of the constructively simple structure of the panel holder, an effective potential equalization is still ensured between the panels and the housing frame of the switchgear cabinet.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Further details of the invention will be explained on the basis of the following figures. In the figures.

DETAILED DESCRIPTION

Example embodiments will now be described more fully with reference to the accompanying drawings.

Figure 1:
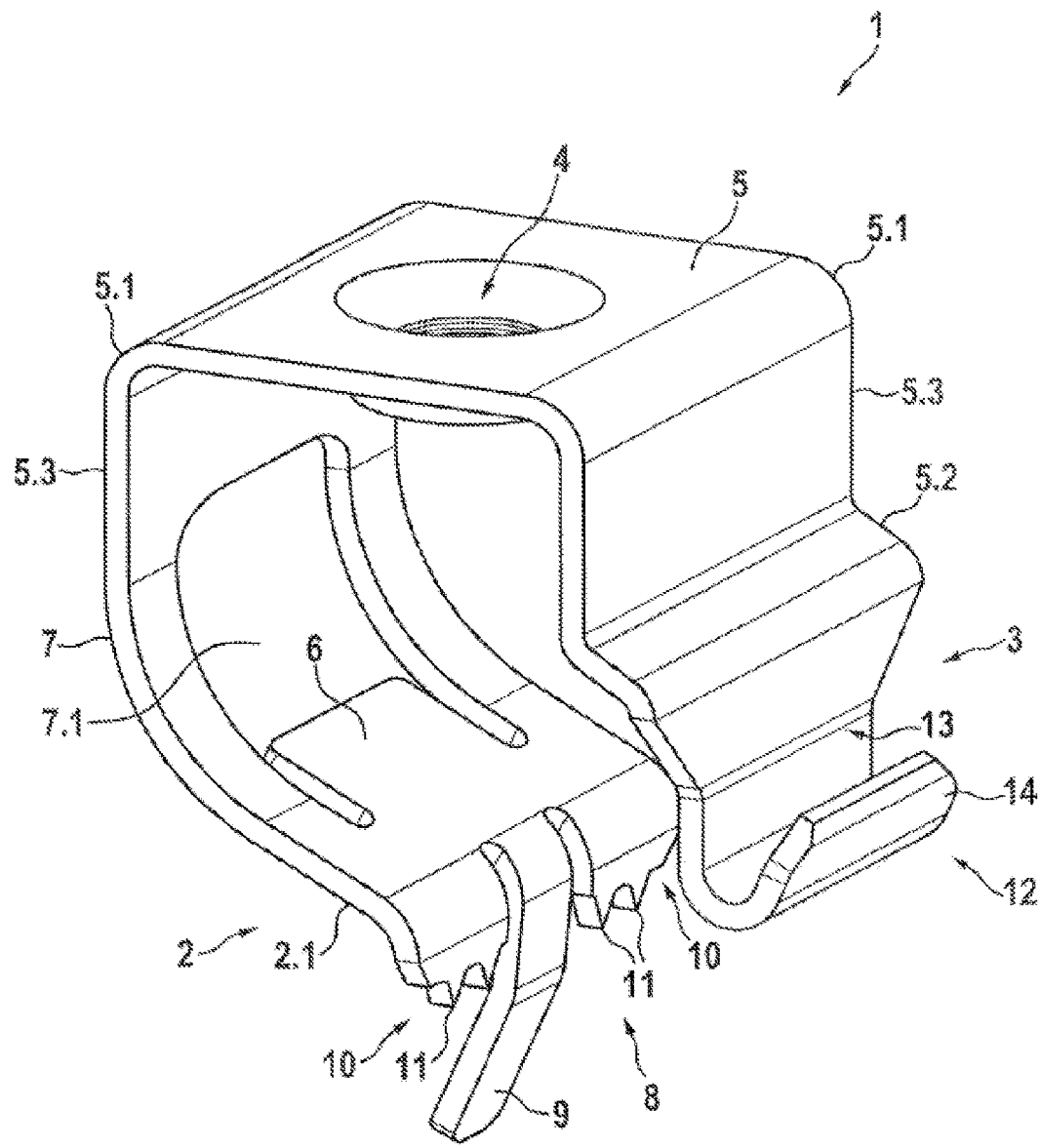
FIG. 1 shows an embodiment of a panel holder in a perspective illustration.

FIG. 1 shows an exemplary embodiment of a panel holder 1. It is designed as a sheet-metal shaped part, in which the various panel holder sides merge into one another via folded edges. The panel holder 1 is recognizably integrally formed. The panel holder 1 in particular has a fastening flange 5 having a threaded passage 4, which is designed as a threaded bore. Connecting portions 5.3 spaced apart in parallel are formed on the fastening flange 5 via 90° folds 5.1, which merge at opposing sides of the fastening flange 5 into the fastening flange 5. One of the connecting portions 5.3 merges into a bracing portion 7, on which the first push-in portion 2 is formed on its end facing away from the connecting portion 5.3. The other connecting portion 5.3 connects the fastening flange 5 to the second push-in portion 3, wherein an offset 5.2 is formed between the connecting portion 5.3 and the second push-in portion 3. A hook 14 is formed on the free end of the second push-in portion 3 on the outer side 13 of the panel holder 1. The hook 14 is oriented in its dimensions to engage in a formfitting manner in a recess in a frame profile of a switchgear cabinet (not shown) and engage behind a border of the recess.

The bracing portion 7 has a cutout 7.1. The bracing portion 7 can thus absorb at least substantial parts of the deformation of the panel holder 1 during the bracing of the panel holder 1.

A deflector face 6 of the first push-in portion 2 is arranged aligned with the threaded bore 4, and therefore a screw screwed into the panel holder 1 via the threaded bore 4 encounters the deflector face 6 from a specific screw-in depth and braces the panel holder 1, in particular the two push-in portions 2, 3 in relation to one another by further screwing in, wherein, as already described, a substantial part of the bending torque exerted on the holder 1 via the screw is absorbed by the bracing portion 7.

On a free end of the first push-in portion 2, the first push-in portion 2 has a push-in lug 9, via which the first push-in portion 2 can engage via a recess in a frame profile into the frame profile. The contact side 10 enclosing the push-in lug 9 has gear teeth 11, via which the panel holder 1 can dig through possible painting of the frame profile down to the metallic conductive surface of the frame profile, and therefore a potential equalization is established between the panel holder 1 and the profile.

Figure 2:
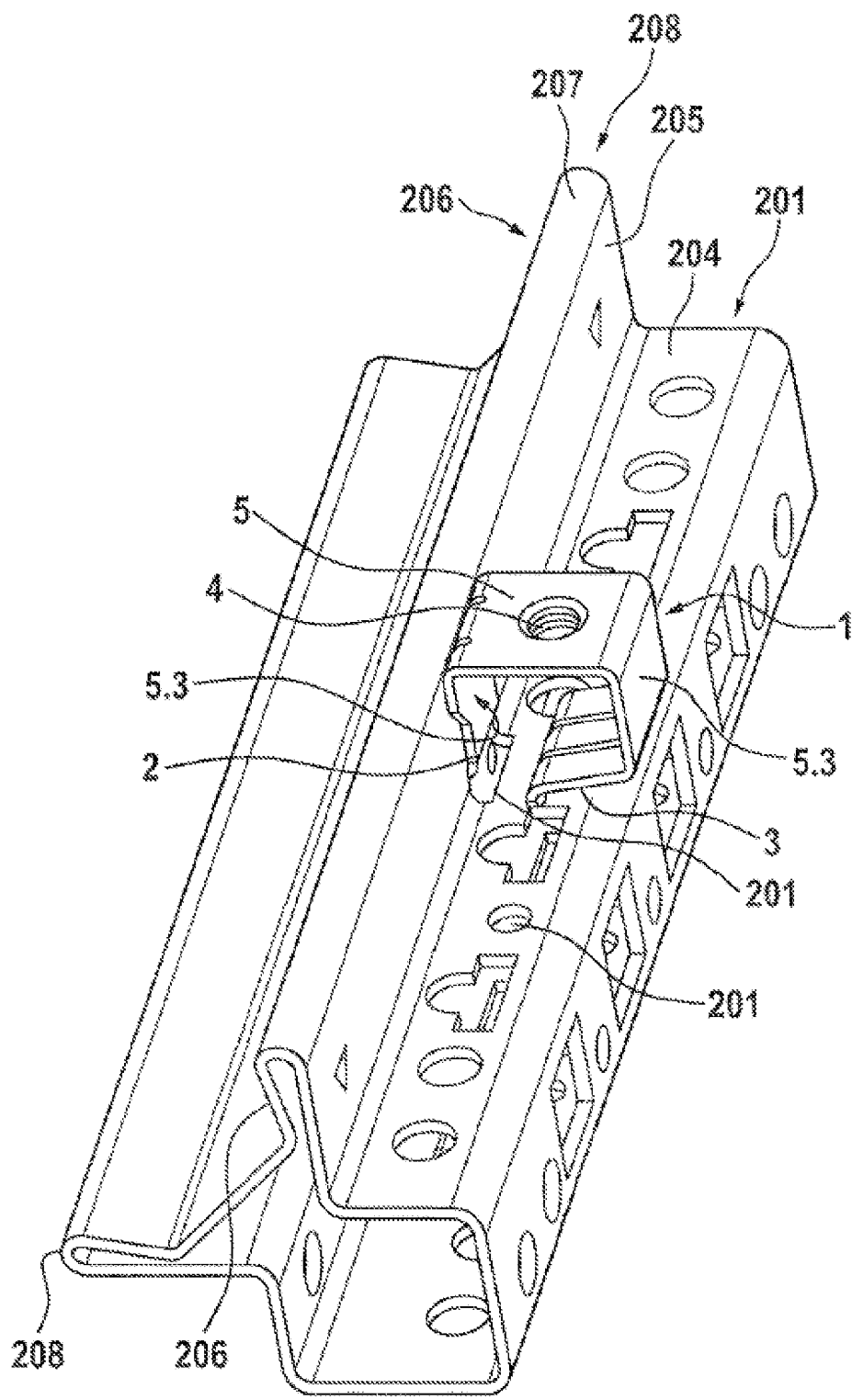
FIG. 2 shows an arrangement of a profile strut and a panel holder pre-mounted thereon according to one embodiment in a perspective illustration.

FIG. 2 shows a horizontal or vertical strut 202, 203 of a housing frame 200, on which a panel holder 1 is premounted. For this purpose, the panel holder 1 engages via its two push-in ends 2, 3 in recesses 201 of the horizontal or vertical strut 202, 203. The geometry of the holder 1 in the relaxed state is adapted to the position and dimensions of the recesses 201 such that the panel holder 1 is inserted, therefore clipped with pre-tension into the recesses 201, and therefore the panel holder 1 is captively fixed on the horizontal or vertical strut 202, 203. The recesses 201 can be part of a system perforation of a first profile side 204, for example, which forms a mounting side for the interior construction of the switchgear cabinet. A second profile side 205 of the frame profile extends substantially perpendicular to the first profile side 204, and therefore the two profile sides 204, 205 form a receptacle for the panel holder 1. In particular, the second profile side 205 can form a sealing web with a further profile side 206, by these merging into one another via a fold 207, which encloses 180°, for example, even more than 180° here. The sealing edge 208 formed can come into contact, for example, on a sealing element arranged on the inner side of a panel, for example, a foamed-on PU sealing compound, to thus seal off the panel in relation to the housing frame.

It can furthermore be seen that the sealing edge 208 protrudes beyond the fastening flange 5, so that when the panel (not shown) is screwed on via the threaded passage 4 of the panel holder 1, the sealing edge 208 can penetrate into a sealing element (not shown) on the inner side of the panel and/or can deform/compress the sealing element accordingly.

Figure 3:
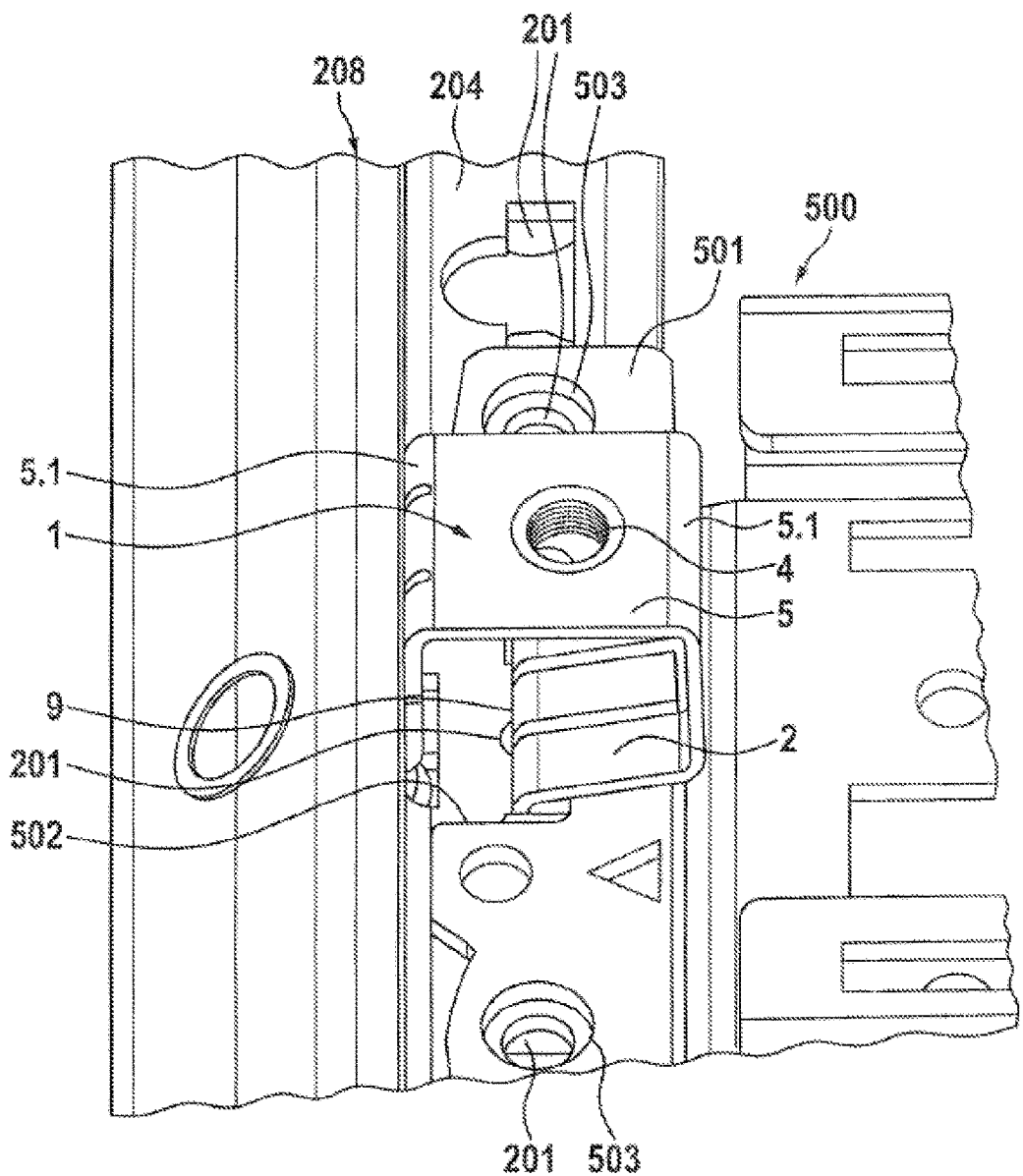
FIG. 3 shows an arrangement of a profile strut and panel holder and mounting chassis pre-mounted thereon according to one embodiment in a perspective illustration.

As shown in FIG. 3, the first profile side 204 of the profile strut can be a mounting side for the interior construction of a switchgear cabinet, via which a mounting chassis 500 can be fixed on the frame profile. To prevent a panel holder 1 also fixed via the first profile side 204 from obstructing the interior construction of the switchgear cabinet interior, the mounting chassis 500 has a cutout 502 in its fastening flange 501, and therefore the fastening flange 501 modifies the panel holder, and/or the first push-in portion can pass through the fastening flange 501 of the mounting chassis 500. For the fastening of the mounting chassis 500 on the first profile side 204, the fastening flange 501 has passages 503, which align with recesses 201 of the first profile side 204 and can thus be used, for example, for guiding through screw connectors.

Figure 4:
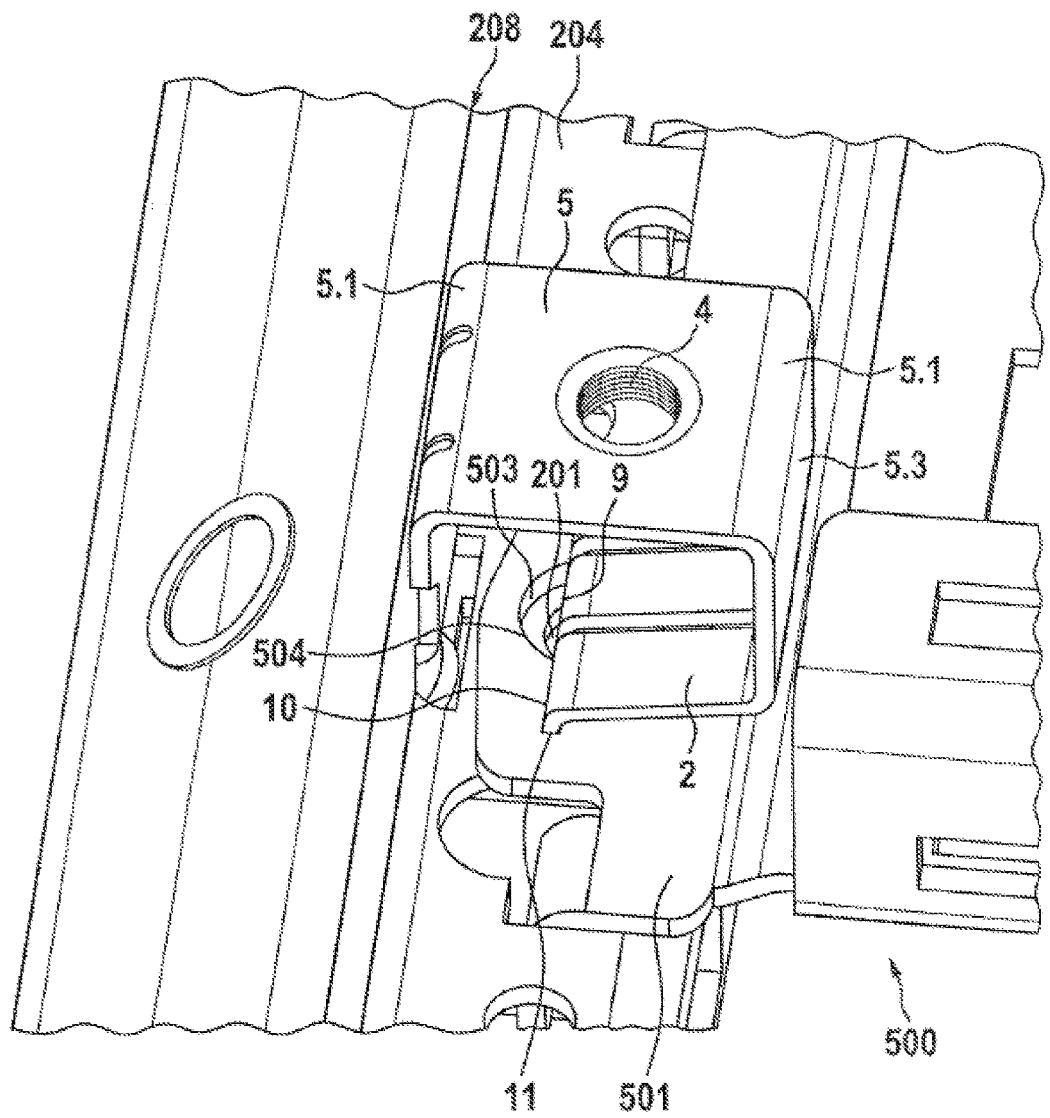
FIG. 4 shows an arrangement of a profile strut having panel holder and mounting chassis pre-mounted thereon according to a further embodiment in a perspective illustration.

Alternatively or additionally to the arrangement according to FIG. 3, FIG. 4 shows an embodiment in which the fastening flange 501 of the mounting chassis 500 has a feedthrough 503, via which the first push-in portion 2 can engage at least with its push-in lug 9 through into the first profile side 204. The first push-in portion 2 bears with its contact side 10, in particular via the gear teeth 11 formed thereon, on a border 504 of the feedthrough 503, and therefore an electrical potential equalization is formed between the panel holder 1 and the mounting chassis 500.

Figure 5:
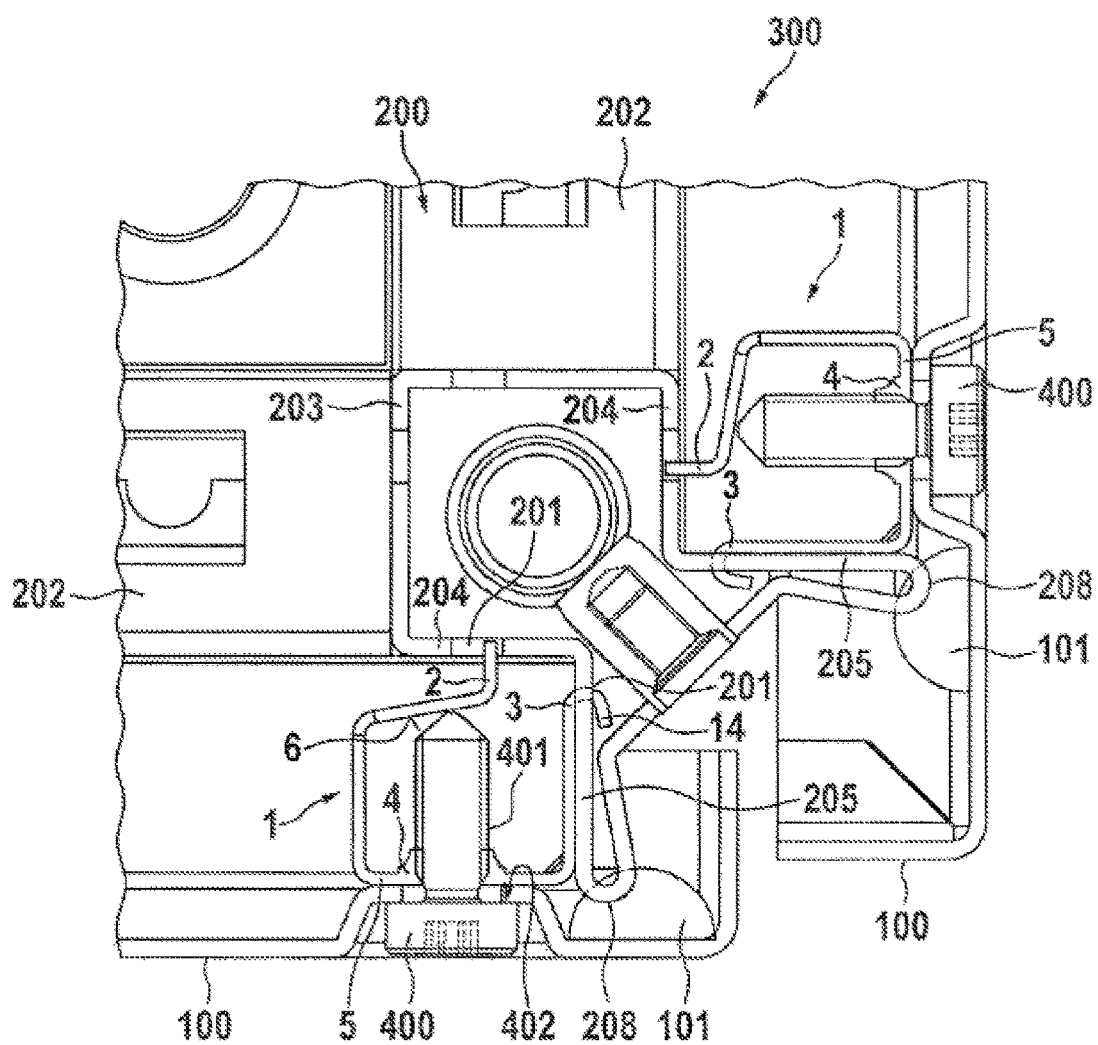
FIG. 5 shows a detail view of a horizontal cross section of a switchgear cabinet in the corner region, having two panels fixed via a panel holder on the housing frame.

FIG. 5 shows a switchgear cabinet 300 in the corner region, more precisely a horizontal cross section through it. The housing frame 200 of the switchgear cabinet 300 can be seen, which is assembled in the corner region of two horizontal struts 202 perpendicular to one another and a vertical strut 203 perpendicular thereto. Two panels 100 are fixed perpendicularly to one another on the vertical strut 203 via a panel holder 1 in each case. It can be seen that the panel holders 1 engage in each case with the hooks 14 thereof via a recess in the second profile sides 205 and engage behind the second profile sides 205, while the first push-in portion 2 engages with its free end, which can have a push-in lug 9 (cf. FIG. 1) via a further recess 201 in the first profile side 204 into the vertical profile.

The panels 100 are each fastened via a screw 400 having a cup point 401 on the outer circumference on the panel holder 1, wherein the screw 400 bears with its conical tip on the deflector face 6 of the first push-in portion 2, and therefore in the course of screwing the screw 400 into the panel holder 1 through the threaded passage 4, the push-in portions 2, 3 are braced in relation to one another and a fixed connection is thus formed between panel 100, panel holder 1, and vertical profile 203. The screw 400 has gear teeth 402 on its screw head underside, and therefore a potential equalization is also provided between the screw 400 and the panel 100. A potential equalization is established between the screw 400 and the panel holder 1 via the cup point 401 and the threaded passage 4. The panel holder 1 again establishes via its gear teeth 11 (cf. FIG. 1) a potential equalization between itself and the first profile side 204, therefore the vertical strut 203 and thus the housing frame 200. Finally, it is shown that the sealing edge 208 of the vertical profile 203 protrudes beyond the fastening flange 5 having the threaded passage 4, and therefore when the panel bears on the panel holder 1, the sealing edge 208 enters into the seal element 101 on the inner side of the panel 100 and/or compresses the seal 101, and therefore the panel 100 is sealed off in relation to the housing frame 200.

Figure 6:
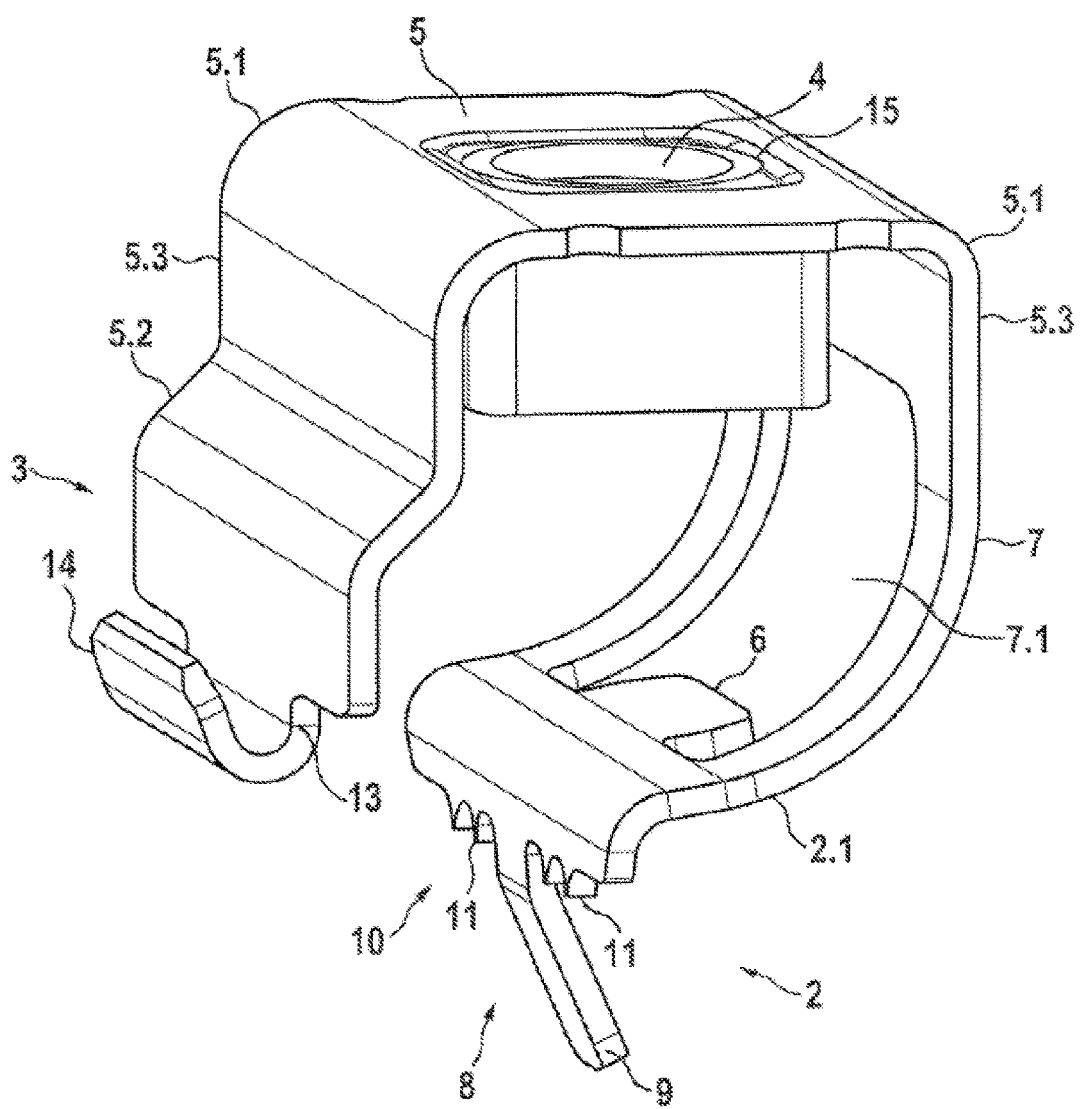
FIG. 6 shows a further embodiment of a panel holder in a perspective illustration.

FIG. 6 shows a further embodiment of a panel holder, in which the threaded passage 4 is not formed as in the embodiment according to FIG. 1 as a threaded bore through the fastening flange, but rather is instead provided by a press-fit nut fixed in a passage opening 15 in the fastening flange 5. The press-fit nut is pressed into the passage opening 15 of the fastening flange 5 in this case from the lower side of the fastening flange 5, and therefore the press-fit nut is accommodated between the two opposing connecting portions 5.3, which are formed via 90° folded edges on the fastening flange.

The features of the invention disclosed in the above description, in the drawings, and in the claims can be essential for the implementation of the invention both individually and also in any arbitrary combination.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A panel holder for fastening a panel on a housing frame of a switchgear cabinet, comprising wherein the panel holder is an open clip, which has two free push-in portions, which can be braced against one another for engagement in a recess of a housing frame, wherein the push-in portions are connected to one another by means of a fastening flange for a panel, said flange having a threaded passage, and wherein the fastening flange is arranged at a distance from one of the push-in portions and the threaded passage is arranged in alignment with the one push-in portion, such that a screw screwed in through the threaded passage impinges on the one push-in portion aligned with the threaded passage and thus braces the two push-in portions against one another; and
   the one push-in portion aligned with the threaded passage has a deflector face for a screw screwed in through the threaded passage, which, at least in a relaxed state of the panel holder, extends nonparallel and at an angle between 10° and 60° in relation to the fastening flange.

2. The panel holder as claimed in claim 1, which exclusively consists of an integrally embodied sheet-metal shaped part.

3. The panel holder as claimed in claim 1, in which the threaded passage is a threaded bore through the fastening flange or a press-fit nut or welded nut fixed in a passage opening through the fastening flange.

4. A switchgear cabinet having a housing frame made of vertical struts and horizontal struts formed as hollow profiles, on which at least one panel is fixed on an outer side of the housing frame via a panel holder as claimed in claim 1.

5. The switchgear cabinet as claimed in claim 4, in which at least one of the vertical and horizontal struts has two profile sides extending at an angle in relation to one another and merging into one another, wherein the one push-in portions engages in a first of the two profile sides and the other push-in portions engages in a second of the two profile sides.

6. A panel holder for fastening a panel on a housing frame of a switchgear cabinet, comprising wherein the panel holder is an open clip, which has two free push-in portions, which can be braced against one another for engagement in a recess of a housing frame, wherein the push-in portions are connected to one another by means of a fastening flange for a panel, said flange having a threaded passage, and wherein the fastening flange is arranged at a distance from one of the push-in portions and the threaded passage is arranged in alignment with the one push-in portion, such that a screw screwed in through the threaded passage impinges on the one push-in portion aligned with the threaded passage and thus braces the push-in portions against one another; and in which the one push-in portion aligned with the threaded passage is connected via a curved bracing portion to the fastening flange, wherein the one push-in portion aligned with the threaded passage has a free push-in lug on its end facing away from the curved bracing portion for the engagement in a housing frame.

7. The panel holder as claimed in claim 6, in which the push-in lug protrudes from a contact side of the end, facing away from the curved bracing portion, of the push-in portion aligned with the threaded passage, wherein the contact side has gear teeth or contact claws.

8. A panel holder for fastening a panel on a housing frame of a switchgear cabinet, comprising wherein the panel holder is an open clip, which has two free push-in portions, which can be braced against one another for engagement in a recess of a housing frame, wherein the push-in portions are connected to one another by means of a fastening flange for a panel, said flange having a threaded passage, and wherein the fastening flange is arranged at a distance from one of the push-in portions and the threaded passage is arranged in alignment with the one push-in portion, such that a screw screwed in through the threaded passage impinges on the one push-in portion aligned with the threaded passage and thus braces the push-in portions against one another; and in which the other push-in portion has a hook on its end facing away from a mounting flange on an outer side of the panel holder.

9. A switchgear cabinet comprising a housing frame made of vertical struts and horizontal struts formed as hollow profiles, on which at least one panel is fixed on an outer side of the housing frame via a panel holder wherein the panel holder is an open clip, which has two free push-in portions, which can be braced against one another for engagement in a recess of a housing frame, wherein the push-in portions are connected to one another by means of a fastening flange for a panel, said flange having a threaded passage, and wherein the fastening flange is arranged at a distance from one of the push-in portions and the threaded passage is arranged in alignment with the other push-in portion, such that a screw screwed in through the threaded passage impinges on the one push-in portion aligned with the threaded passage and thus braces the push-in portions against one another; and in which a first of the two profile sides has an arrangement of recesses for the interior construction of the switchgear cabinet and a second of the profile sides, with a further profile side, which merges via a folded edge having a direction change comprising at least 180° into the second profile side, forms a sealing edge for sealing off the panel in relation to the housing frame in which at least one of the vertical and horizontal struts has two profile sides extending at an angle in relation to one another and merging into one another, wherein the one push-in portion engages in a first of the two profile sides and the other push-in portion engages in a second of the two profile sides.

10. A switchgear cabinet comprising a housing frame made of vertical struts and horizontal struts formed as hollow profiles, on which at least one panel is fixed on an outer side of the housing frame via a panel holder on which at least one panel is fixed on an outer side of the housing frame via a panel holder wherein the panel holder is an open clip, which has two free push-in portions, which can be braced against one another for engagement in a recess of a housing frame, wherein the push-in portions are connected to one another by means of a fastening flange for a panel, said flange having a threaded passage, and wherein the fastening flange is arranged at a distance from one of the push-in portions and the threaded passage is arranged in alignment with the one push-in portion, such that a screw screwed in through the threaded passage impinges on the one push-in portion aligned with the threaded passage and thus braces the push-in portions against one another; and in which the panel is connected via a screw screwed into the threaded passage to the panel holder, wherein the screw has a cup point for the electrical contacting of the threaded passage and has gear teeth on its screw head side facing toward the panel.

11. A switchgear cabinet comprising a housing frame made of vertical struts and horizontal struts formed as hollow profiles, on which at least one panel is fixed on an outer side of the housing frame via a panel holder on which at least one panel is fixed on an outer side of the housing frame via a panel holder wherein the panel holder is an open clip, which has two free push-in portions, which can be braced against one another for engagement in a recess of a housing frame, wherein the push-in portions are connected to one another by means of a fastening flange for a panel, said flange having a threaded passage, and wherein the fastening flange is arranged at a distance from one of the push-in portions and the threaded passage is arranged in alignment with the one push-in portion, such that a screw screwed in through the threaded passage impinges on the one push-in portion aligned with the threaded passage and thus braces the push-in portions against one another; and in which at least one of the vertical and horizontal struts has two profile sides extending at an angle in relation to one another and merging into one another, wherein the one push-in portion engages in a first of the two profile sides and the other push-in portion engages in a second of the two profile sides, the switchgear cabinet further including:

- a mounting chassis for the interior construction of the switchgear cabinet, wherein a first of the profile sides has an arrangement of recesses and the mounting chassis is mounted via its fastening flange on the profile side having the recesses, and wherein
- a) the fastening flange has a cutout, in which the push-in portion engaging in the profile side is accommodated; or
- b) the fastening flange has at least one feedthrough, which aligns with one of the recesses and the panel holder engages with the push-in portion engaging in the first profile side through the feedthrough into the first profile side, wherein the push-in portion engaging in the first profile side has contact teeth, using which it electrically contacts a border of the feedthrough.

\* \* \* \* \*